(12) United States Patent
Maloney et al.

(10) Patent No.: US 7,405,106 B2
(45) Date of Patent: Jul. 29, 2008

(54) QUAD FLAT NO-LEAD CHIP CARRIER WITH STAND-OFF

(75) Inventors: John J. Maloney, Essex Junction, VT (US); Robert M. Smith, Jericho, VT (US); Charles H. Wilson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 11/439,016

(22) Filed: May 23, 2006

(65) Prior Publication Data

US 2007/0273017 A1   Nov. 29, 2007

(51) Int. Cl.
*H01L 21/44* (2006.01)
*H01L 21/48* (2006.01)
*H01L 21/50* (2006.01)

(52) U.S. Cl. .................. 438/111; 438/112; 438/121

(58) Field of Classification Search .......... 438/106, 438/111, 112, 121, 123; 257/E23.031
See application file for complete search history.

(56) References Cited

U.S. PATENT DOCUMENTS

| | | | |
|---|---|---|---|
| 5,808,354 A | 9/1998 | Lee et al. ............. | 257/666 |
| 5,920,116 A | 7/1999 | Umehara et al. ....... | 257/669 |
| 6,621,152 B2 | 9/2003 | Choi et al. ........... | 257/678 |
| 6,861,734 B2 | 3/2005 | Minamio et al. ....... | 257/666 |
| 6,882,057 B2 | 4/2005 | Hsu .................... | 257/784 |
| 6,897,550 B1 | 5/2005 | Zwenger et al. ....... | 257/666 |
| 7,122,406 B1 * | 10/2006 | Yilmaz et al. ......... | 438/123 |
| 2003/0006055 A1 * | 1/2003 | Chien-Hung et al. ... | 174/52.1 |
| 2003/0178708 A1 | 9/2003 | Minamio et al. ....... | 257/666 |

* cited by examiner

*Primary Examiner*—Thien F Tran
(74) *Attorney, Agent, or Firm*—John A. Jordan; William H. Steinberg

(57) ABSTRACT

A QFN package with improved joint solder thickness for improved second level attachment fatigue life. The copper leadframe of a QFN chip carrier is provided with rounded protrusions in both the chip attach pad region and the surrounding lead regions before second level attachment. The rounded stand-off protrusions are formed from the copper itself of the copper of the leadframe. This may be achieved by punching dimples into one surface of the copper plate of the leadframe before plating to form protrusions on the opposing surface. This method of forming the rounded protrusions simplifies the process of forming stand-offs. The protrusions provide a structure that increases wetting area and allows the use of a larger quantity of solder for increased solder joint thickness and better die paddle solder joint area coverage. As a result of the increased solder joint thickness, second level fatigue life is significantly improved. As a result of the improved die paddle solder joint area coverage, improved thermal performance of the chip carrier is also significantly improved.

10 Claims, 4 Drawing Sheets

QUAD FLAT NO-LEAD CHIP CARRIER WITH STAND-OFF

BACKGROUND OF THE INVENTION

1. Field of the Invention

The present invention relates to chip carriers. More particularly, the present invention relates to quad flat no-lead (QFN) chip carriers and chip package structures.

2. Background and Related Art

Semiconductor packages are known to take a variety of forms. Similarly, chip carriers used in semiconductor packages take a variety of forms. One type of chip package currently used employs a leadframe arrangement. According to the type of leads used in the leadframe, a quad flat package (QFP) can be divided into quad flat packages with I-type leads (QFI), quad flat packages with J-types leads (QFJ) and quad flat packages no-lead (QFN). Because the outer end of the leads of the leadframe are uniformly cut along the four edges of a chip package, this latter type of package is also referred to as a quad flat no-lead chip carrier.

FIG. 1 shows a plan view of the bottom side of a conventional QFN chip carrier. This is the side of the QFN opposite to the side to which the chip is mounted. Leadframe 1 comprises die paddle 5 and leads 6. As shown, leads 6 are arranged around the periphery of the four-sided leadframe. The arrangement shown has 8 leads per side for a total of 32 leads. Typically, leadframe 1 comprises a flat piece of copper that has a pattern (the leads and the die paddle) which pattern may, for example, be etched or stamped out of the flat piece of copper.

As shown in the cross-sectional view of FIG. 2, die or chip 7 is mounted on die paddle 5. As employed herein, the terms die and chip are used interchangeably to mean a semiconductor chip. Lead contacts 3 typically comprise plating layer 9, such as silver plating, and plating layer 11, such as solder, both plated onto copper lead 6. Gold wires 13, for example, may form connections between chip 7 and lead contacts 3. Gold wire 15 may, for example, form a ground connection. The arrangement is then encased in a mold compound 17.

Normally, for second level interconnect, the QFN chip carrier is mounted on a printed circuit board (PCB). The mounting process involves soldering the lead contacts 3 and die paddle 5 to pads on the PCB. However, because the copper of lead contacts 3 and die paddle 5 protrudes from mold compound 17 by a small amount (e.g. 0.05 mm), soldering the lead contacts to pads on the PCB can be problematic. FIG. 3 shows solder connections 19 between copper leads 6 of leadframe 3 and pads 21, and solder connection 20 between die paddle 5 and conductive pad 22 on PCB 23.

Several problems arise as a result of the limited protrusion of stand-off of copper lead contacts 3 and die paddle 5 of leadframe 1. For example, the limited protrusion limits the ability of the solder to wet due to the small area on the side of copper leads 6. In addition, the amount of solder used must be limited in order to reduce solder shorting between leads and, accordingly, helps improve yield. Yields are also affected due to the tendency of the QFN to float on the solder paste at assembly, which floating acts to cause the QFN to misalign with the PCB pads during solder reflow. Yields are further affected due to opens caused by lead co-planarity and by the QFN being tilted when placed in the solder paste.

SUMMARY OF THE PRESENT INVENTION

Accordingly, it is an object of the present invention to provide an improved chip carrier.

It is a further object of the present invention to provide a chip carrier which improves the yields in assembly to a substrate therefor.

It is yet a further object of the present invention to provide a QFN chip carrier with increased solder area for the leads and die pad, thereby providing improved solder joint strength when attached to a substrate, such as, a PCB.

It is yet another object of the present invention to provide a QFN chip carrier which attaches to a PCB, or the like, with improved solder joint reliability and yield.

It is yet another object of the present invention to provide a QFN chip carrier which connects to pads on a substrate through solder joints with improved fillets and higher stand-off.

In accordance with the present invention, a QFN chip carrier is provided with stand-offs which act to improve connection to a PCB, for example. The stand-offs take the form of rounded protrusions or bumps formed in the QFN leads and over the area of the die paddle. The rounded protrusions act to provide more QFN area for the solder to wet when the chip carrier is connected to pads on a PCB, for example. In addition, the rounded protrusions allow for formation of taller solder joints at QFN/PCB connection. The rounded protrusions may be formed by stamping dimples into the QFN copper plate used to form the leads and die paddle.

The rounded protrusions not only act to allow for higher solder joint thicknesses but also allow for the formation of better fillets. Not only is the strength of the solder joint improved but there is less possibility of shorting at QFN placement and reflow. Also, the process step of "picking and placing" the QFN into solder paste thickness results in less solder paste "push out" because of the rounded protrusions. In addition, with the rounded protrusion stand-offs, there is less floating of the QFN at reflow.

DETAILED DESCRIPTION

Figure 1:
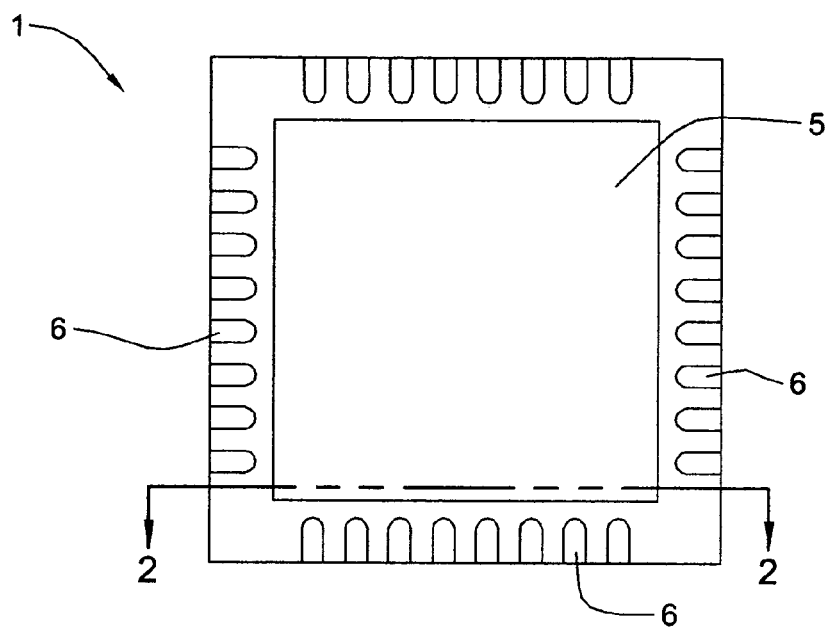
FIG. 1 shows a plan view of the bottom side of a conventional QFN chip carrier.

The bottom of a conventional QFN chip carrier is shown in FIG. 1. This is the side of the carrier that attaches to a substrate, such as, a PCB. Typically, the QFN chip carrier comprises a leadframe made from a flat copper plate. The leadframe 1 in FIG. 1 comprises a pattern that includes copper die paddle 5 and leads 6. The pattern of the paddle and leads may be etched or stamped out of the flat copper plate.

Figure 2:
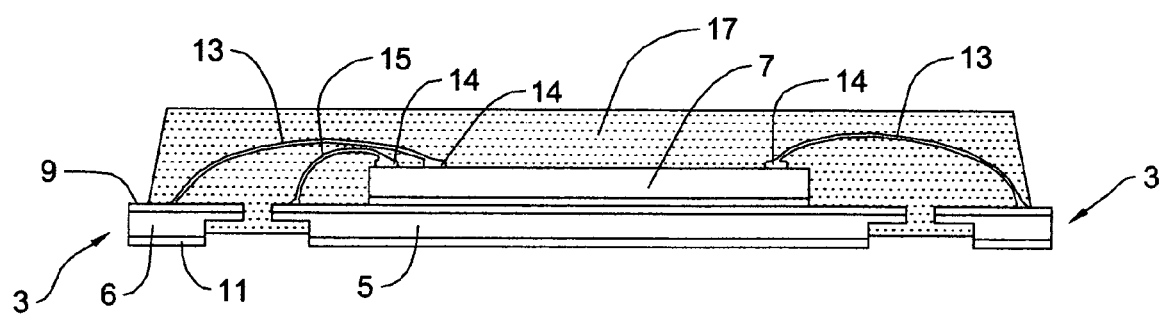
FIG. 2 shows a cross-sectional view of the conventional QFN chip carrier of FIG. 1 taken along line at 2-2.

FIG. 2 shows a cross-sectional view of the QFN chip carrier of FIG. 1 taken along line 2-2. As shown, copper leads 6 are plated on the top with a layer 9 of, for example, silver and on the bottom with a layer 11 of, for example, solder to thereby form lead contacts 3. In this regard, it can be seen that the surfaces of die paddle 5 are also similarly plated on top and bottom at the same time leads 6 are plated. Wires 13, made of gold for example, connect contact pads 14 on chip 7 to lead contacts 3. Similarly, gold wire 15 forms a ground connection. As shown, this assembly is encapsulated in conventional insulating mold material.

As previously described, since copper lead 6 is limited in its protrusion, the surface over which solder may wet in joining the chip carrier to the pads on a substrate, such as a PCB, is also limited. This limited protrusion not only limits wetting and the ability to make reliable contact in joining the chip carrier to the PCB, it also creates other problems with joining, some of which were previously described.

Figure 3:
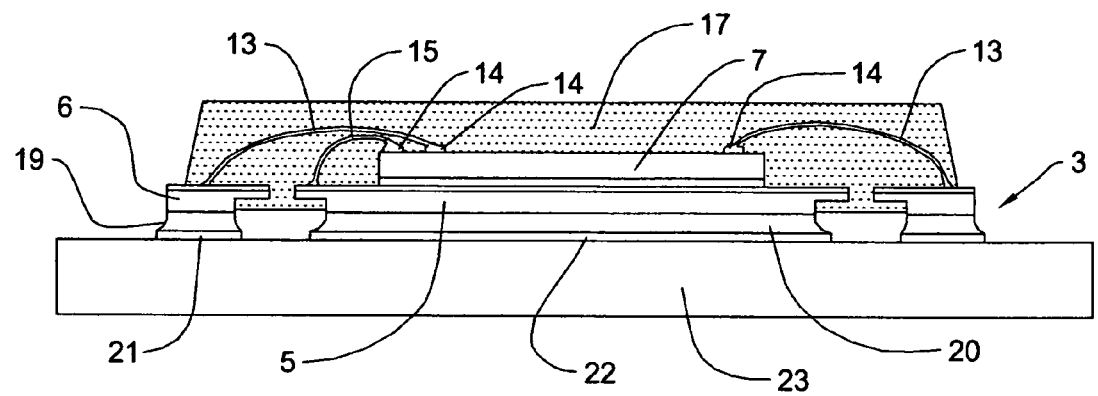
FIG. 3 shows a cross-sectional view of the QFN chip carrier shown in FIG. 2 as attached to a PCB.

FIG. 3 shows a cross-sectional view of the conventional QFN chip carrier of FIG. 2, as mounted on PCB 23. As demonstrated in FIG. 3, respective solder joint connections 19 and 20, between leads 6 and conductive pads 21 and between die paddle 5 and conductive pad 22 on PCB 23, is limited in height due to the limited ability to use a sufficient volume of solder and for the solder to wet.

Figure 4:
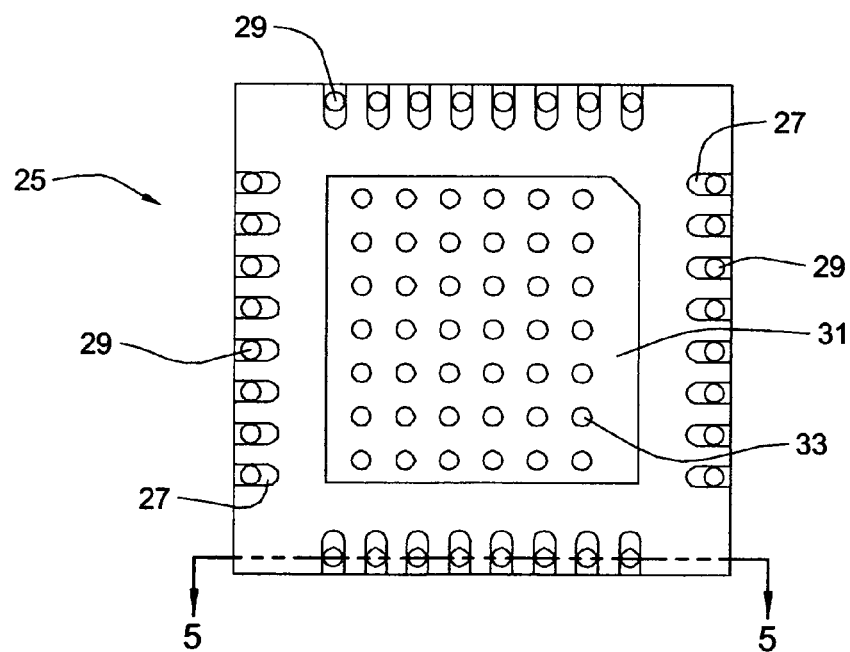
FIG. 4 shows a plan view of the bottom side of a QFN chip carrier, in accordance with the present invention.

The bottom of the QFN chip carrier, in accordance with the present invention, is shown in FIG. 4. The QFN chip carrier embodiment of FIG. 4, which includes copper leadframe 25 with eight copper leads 27 on each side, as previously shown in FIGS. 1-3. However, each of the copper leads also has a rounded protrusion or bump 29 formed therein to provide additional chip carrier standoff. In addition, die paddle 31 also has an array of like rounded protrusions or bumps 33 formed therein. As shown, the array is a 6×7 array of rounded protrusions 33. However, a different array could as readily be employed. Similarly, the number of copper leads along the carrier sides may vary, depending upon the particular application.

Figure 5:
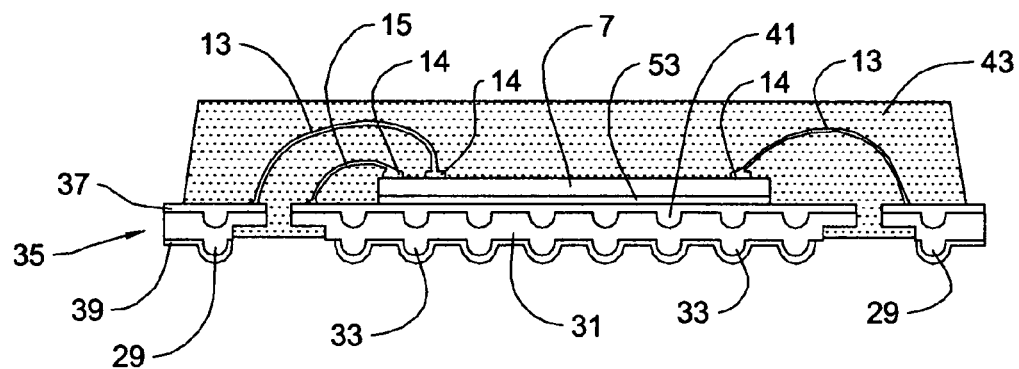
FIG. 5 shows a cross-sectional view of the QFN chip carrier of FIG. 4 taken along line 5-5.

FIG. 5 shows a rotated cross-sectional view of FIG. 4, taken along line 5-5. In FIG. 5, the rounded protrusions are shown along the bottom of the chip carrier with copper lead protrusions, shown at 29, and die paddle protrusions, shown at 33. FIG. 5 also shows wire connections 13 between chip pad 14 and lead contacts 35. Similarly, wire connection 15 provides a ground connection to die paddle 31. These wire connection may be made of any of a variety of conductors, such as, gold.

The rounded protrusions 29 and 33 may be formed in the copper plate of the leadframe before forming the pattern of leads and die paddle. Alternatively, the rounded protrusions may be formed after the pattern of leads and die paddle is formed. The protrusions in the leads and die paddle may also be formed at the same time that the leads and die paddle are formed. Regardless, the copper plate of the leadframe itself is used to form the rounded protrusions. One method of forming the protrusions is to employ a half-stamp or partial stamp process. The die of the stamp would comprise an array of rounded protrusions, similar to the array of protrusions to be stamped into the copper plate of the leadframe. The die of the stamp would then be pressed partially into the plate such as to form a dimple but not so as to break through the plate. Alternatively, a single rounded protrusion in a die may be employed and the protrusions stamped, one at a time, at selected points in the copper plate.

The extent to which the stamp is pressed, i.e., depth of penetration of the dimple, is somewhat a matter of design choice and thickness of the plate. Typically, it would be preferred to obtain the greatest stand-off height, i.e., protrusion height, possible without punching through the plate, consistent with the particular application. For example, rounded protrusions of up to 100 µm would be consistent with current QFN chip carrier technology. It is to be noted that the standoff protrusions, as formed from the copper plate itself, simplifies the process of forming the protrusions, since protrusion attachment method, materials used, position and the like, of the protrusions are readily determined and formed during the leadframe forming process. It should be understood that although the use of stamping has been described for making the rounded protrusions, a molding process for creating the copper plate with integral rounded protrusions could also be employed. The mold, thus, would include dimples in the flat bottom part of the mold.

After stamping the rounded protrusions and the leads and die paddle have been formed, the copper leadframe is then plated. In most cases only the top surface of the leadframe is plated and typically, the top surface of the leadframe is plated with silver, as shown by silver layer 37, although other conductive materials may also be used. As also shown, the voids 41 created by the dimples 33 are also filled with silver. The bottom layer may be plated or otherwise formed on the copper leadframe. Typically the bottom surface of the leadframe is covered with a layer of solder 39, for example, after the chip carrier molding process. There are also other options, such as, using pre-plated leadframes wherein the leadframe is plated on both sides after stamping the rounded protrusions, and the leads and die paddle are formed. In such a case, the top surface is typically plated with silver, as shown by silver layer 37. The bottom layer may be plated or otherwise formed on the leadframe. For preplated leadframes, the bottom surface is typically plated with nickel palladium with a gold flash although other conductive layers may be used.

As can be seen, because of the protrusions, the area covered by solder is increased. It is to be noted that the protrusions in the area of die paddle 31 also act to provide stability and, because the surface is not flat, provides some degree of relief from shock-induced stress, and like stress, for chip 7. In this regard, chip 7 is attached to die paddle 31 with an adhesive 51, such as, Ablebond 2300 paste adhesive or Ablefilm 5320CE dry film adhesive. Although FIGS. 5 and 6 show plated silver layer 37 extending beneath chip 7, typically the area beneath chip 7 would not include silver layer 37 but rather the chip would be directly attached by adhesive to bare copper of the die paddle.

After attaching chip 7 to die paddle 31, the wire connections are made, as hereinabove described, and the assembly is encapsulated in mold 43 of insulating material. The mold may be made, for example, from Loctite FP4450, Nitto GE 1100L, or Sumitomo Bakelite EME-G700 material, for example. After encapsulation, the QFN chip carrier with rounded protrusions for enhanced stand-off is ready for connection to a substrate, such as, a PCB.

Figure 6:
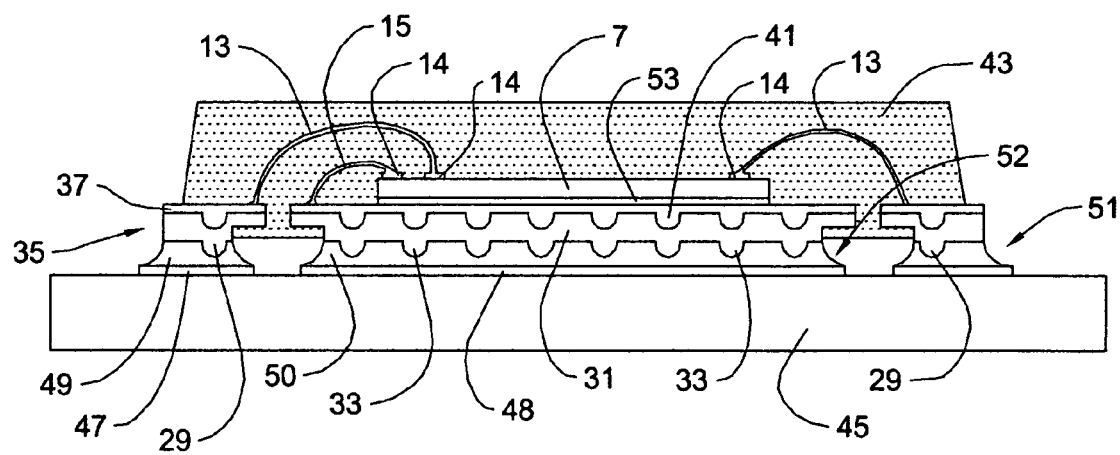
FIG. 6 shows a cross-sectional view of the QFN chip carrier shown in FIG. 5 as attached to a PCB.

FIG. 6 shows the chip carrier of FIG. 5, as attached to a PCB 45. The protrusions 29 and 33 act to provide a structure that allows more wetting area and room for more solder during reflow attachment to pads 47 and 48 on PCB 45. This results in lead solder joints 49 and die paddle solder joint 50 acting to provide more stand-off height, i.e., solder joint thickness, and more solder joint area and integrity with improved fillets, as shown at 51 and 52. The structure also results in less paste "pushout" when the chip carrier is pushed into the solder paste on the PCB during the pick and place process at card assembly. It further offers better self-alignment of the chip carrier leads to the pads on the PCB, less floating of the chip carrier and reduced "shorts" and "opens". Thus, the assembly results in better yield and more overall reliability.

Figure 7:
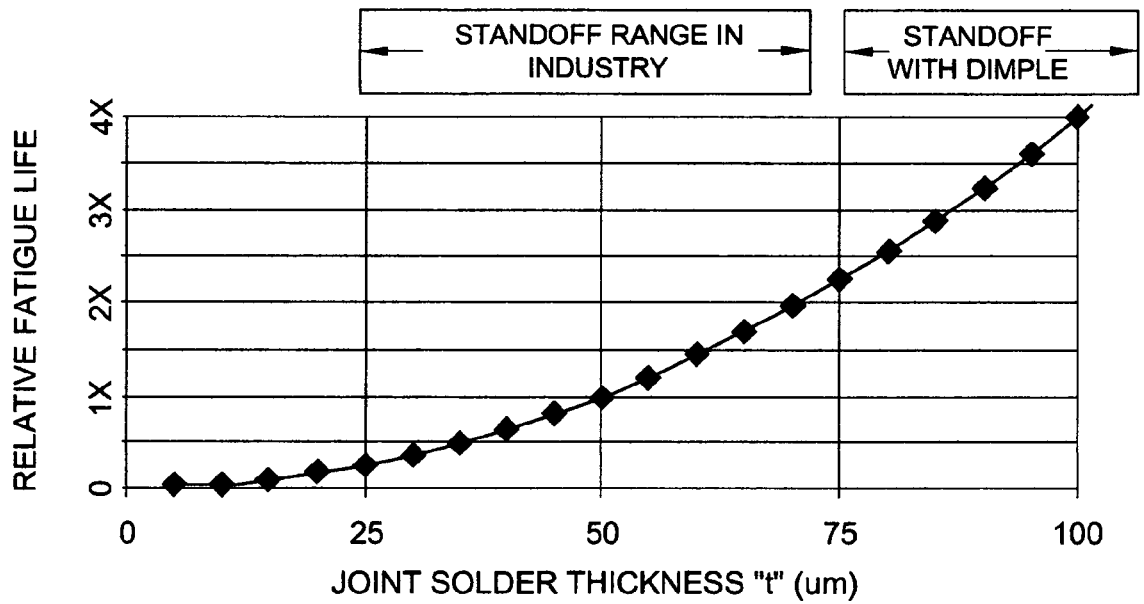
FIG. 7 shows a plot of the expected improvement in QFN second level interconnect fatigue life.

FIG. 7 shows a plot of expected improvement in second level interconnect fatigue life versus QFN solder joint stand-off height. As shown, as conventional solder joint stand-off or joint solder thickness "t" increases up to around 75 µm, fatigue life increases by a factor of about 2. With the rounded protrusion structure, in accordance with the present invention, joint solder thickness or stand-off is expected to increase by a factor of about 4, or twice that of conventional QFN chip carrier arrangements.

Although description has been provided of embodiments of a QFN with leads on four side of a square package, it is clear that the arrangement described in accordance with the present invention could as readily be employed in no lead packages with leads on only two sides, for example. In addition, QFNs with two or dual rows of leads on four sides could also be employed. Similarly, either square or rectangular no lead packages with and without exposed die paddles could, as well, be employed.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of forming an electronic package, comprising:
    forming a pattern in a conductive plate including a chip attach region and conductive lead regions around said chip attach region for connecting a chip to said conductive lead regions on one surface of said conductive plate; and
    forming an array of conductive protrusions extending from said conductive plate on a surface opposing said one surface, said protrusions extending beneath at least said conductive lead regions and formed in said conductive plate by stamping dimples into said one surface at least in said conductive lead regions.

2. The method as set forth in claim 1 wherein said conductive plate is a copper plate.

3. The method as set forth in claim 1 wherein at least a portion of said one surface including conductive lead regions is coated with a layer of conductive material and where at least a portion of said surface opposing said one surface including conductive lead regions is coated with a layer of solder.

4. The method as set forth in claim 3 including the steps of attaching a chip to said chip attach region; and
    electrically connecting pads on said chip to said layer of conductive material on said one surface of respective ones of said conductive lead regions to form a chip package.

5. The method as set forth in claim 4 including the steps of:
    applying solder paste to respective pads on an array of conductive pads on a printed circuit board;
    pressing said chip package into said solder paste so that respective ones of said conductive lead regions coated with a layer of solder align with respective ones of said array of conductive pads on said printed circuit board; and
    reflowing said solder to form solder joints with improved fillets and stand-off height.

6. A method of forming a chip carrier package, comprising:
    forming a leadframe from a conductive plate having a chip attach region and conductive lead regions surrounding said chip attach region;
    forming protrusions extending from one surface of said conductive plate in said chip attach region and conductive lead regions with said protrusions formed as an integral part of said conductive plate;
    coating said conductive lead regions and said chip attach region of said one surface of said conductive plate including protrusions with a layer of solder and plating at least said conductive lead regions of the opposing surface thereof with a layer of metal;
    attaching a chip to the said surface opposing said one surface with an adhesive;
    connecting respective pads on said chip to said layer of metal on respective ones of said conductive lead regions;
    forming a layer of solder on the respective pads of an array of pads on a substrate;
    aligning said layer of solder of said conductive lead regions and chip attach region including protrusions with said respective pads on said substrate so as to extend said protrusions into said layer of solder on said pads; and
    reflowing said solder to form a solder joint connection with improved stand-off.

7. The method as set forth in claim 6 wherein said conductive plate is a copper plate.

8. The method as set forth in claim 7 wherein said protrusions are formed in said one surface of said copper plate by stamping dimples into the said surface opposing said one surface.

9. The method as set forth in claim 8 wherein said layer of metal plated on the said opposing surface thereof is silver.

10. The method as set forth in claim 9 wherein said layer of solder formed on said respective pads of said substrate includes solder formed beneath the chip attach region of said copper plate.

* * * * *